(12) United States Patent
Draving et al.

(10) Patent No.: US 6,362,635 B2
(45) Date of Patent: *Mar. 26, 2002

(54) SPLIT RESISTOR PROBE AND METHOD

(75) Inventors: Steven D Draving, Colorado Springs; John C Kerley, Elbert, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/774,195

(22) Filed: Jan. 29, 2001

Related U.S. Application Data

(63) Continuation of application No. 09/288,347, filed on Apr. 8, 1999.

(51) Int. Cl.[7] ................................................ G01R 1/04
(52) U.S. Cl. ...................... 324/754; 324/158.1; 438/18; 361/767
(58) Field of Search ............................ 324/754, 158.1, 324/72.5, 755; 361/767; 438/18

(56) References Cited

U.S. PATENT DOCUMENTS 6,225,816 B1 * 5/2001 Draving et al. ............. 324/754

* cited by examiner

Primary Examiner—Safet Metjahic
Assistant Examiner—Jimmy Nguyen

(57) ABSTRACT

Disclosed is a system and method for probing target pads in a dense pad array while minimizing distortion of a signal on the pads probed due to the probe load on the target pads and minimizing an amount of cross-talk between aggressor conductors in the dense pad array and the probe tip. In one embodiment, a probe tip arrangement is provided comprising a pad located in a dense pad array and a first probe tip resistor having first and second ends, the first end being coupled to the pad. The first probe tip resistor is positioned directly adjacent to the pad as closely as manufacturing processes will allow. The probe tip arrangement further includes an access transmission line coupled to the second end of the first probe tip resistor and extending outside of the dense pad array to a second probe tip resistor The second probe tip resistor may, in turn, be coupled to an electrical connector which in turn is coupled to a logic analyzer or oscilloscope to test the signal on the respective pad of the pad array.

16 Claims, 17 Drawing Sheets

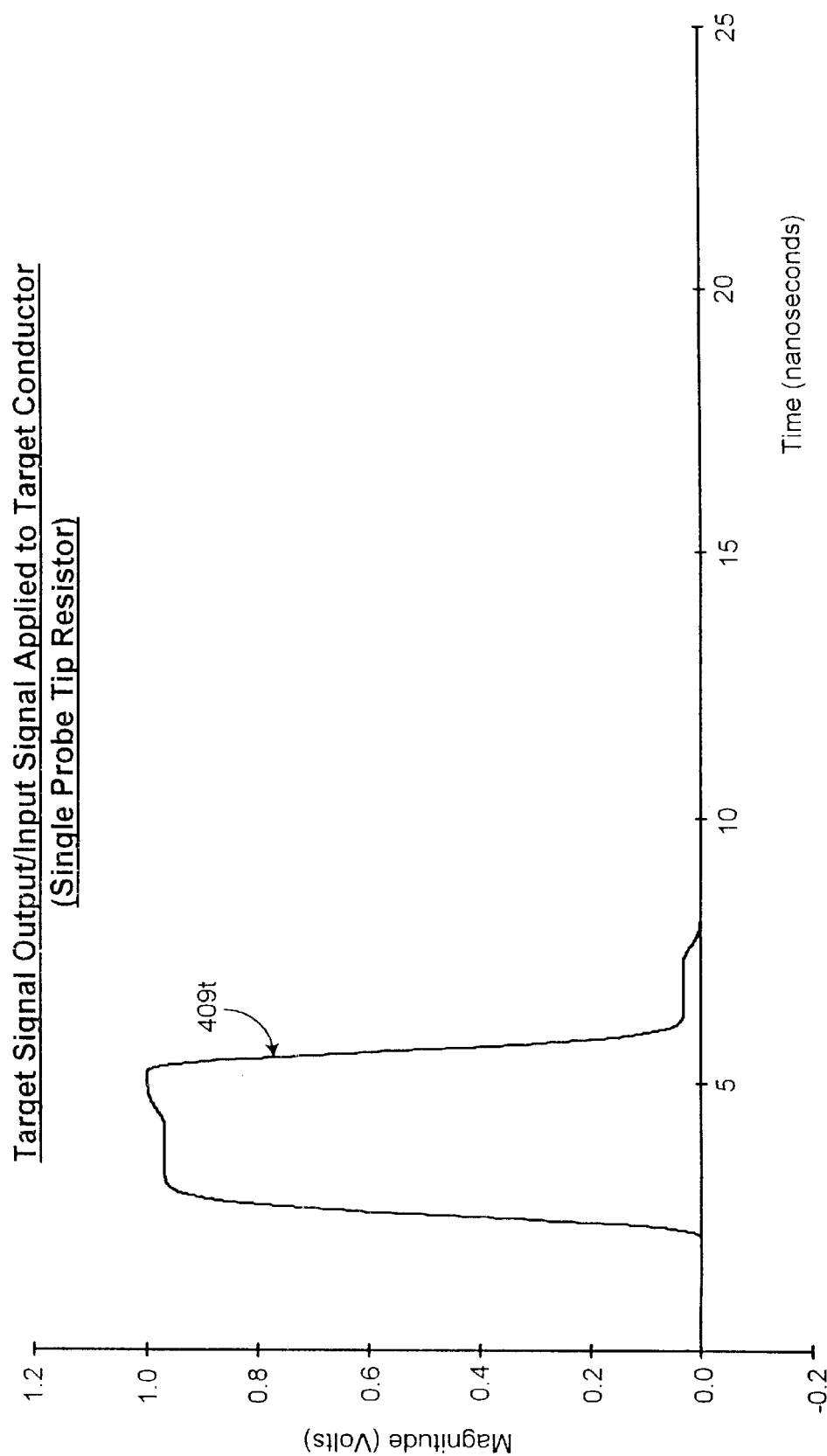

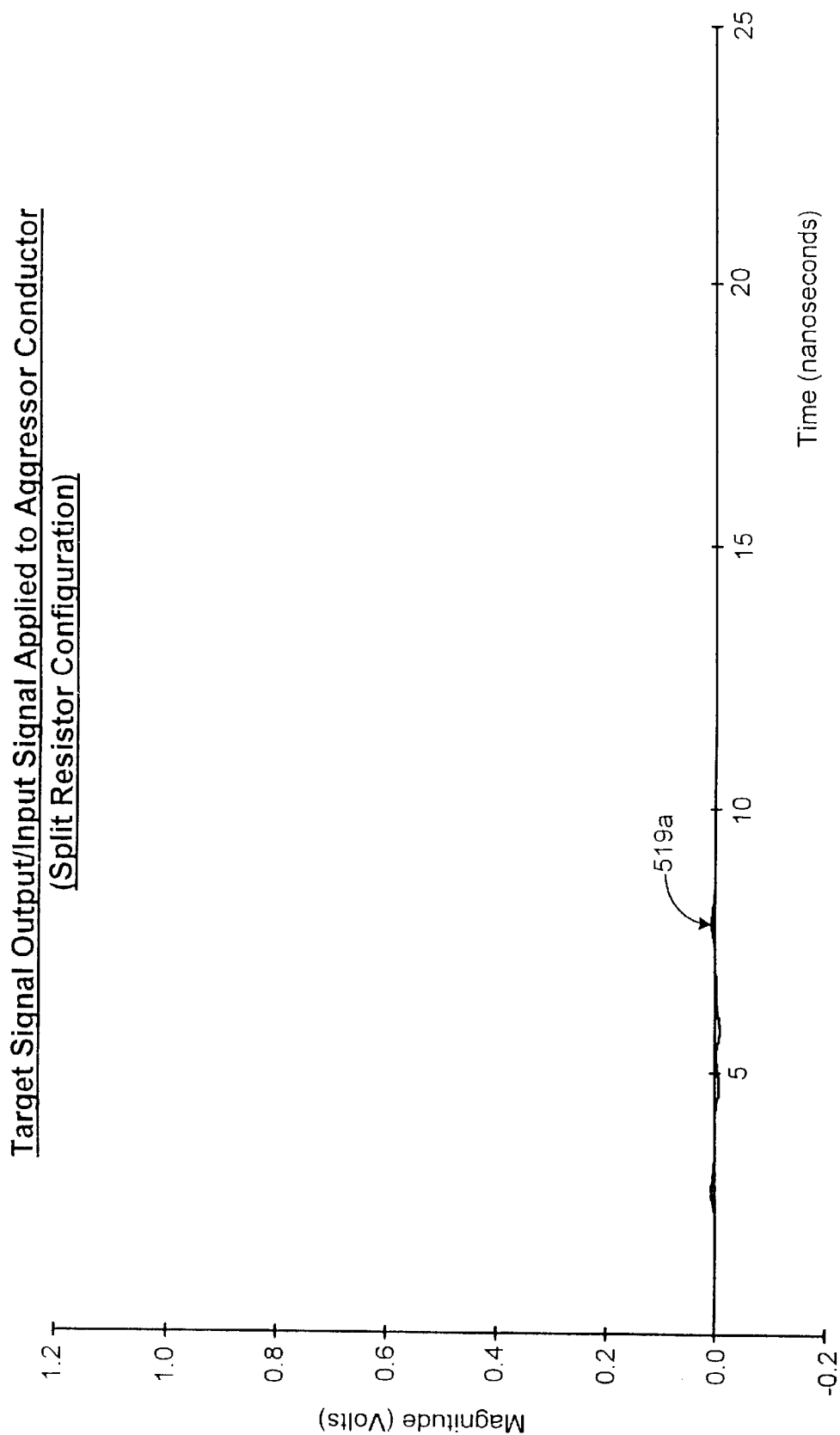

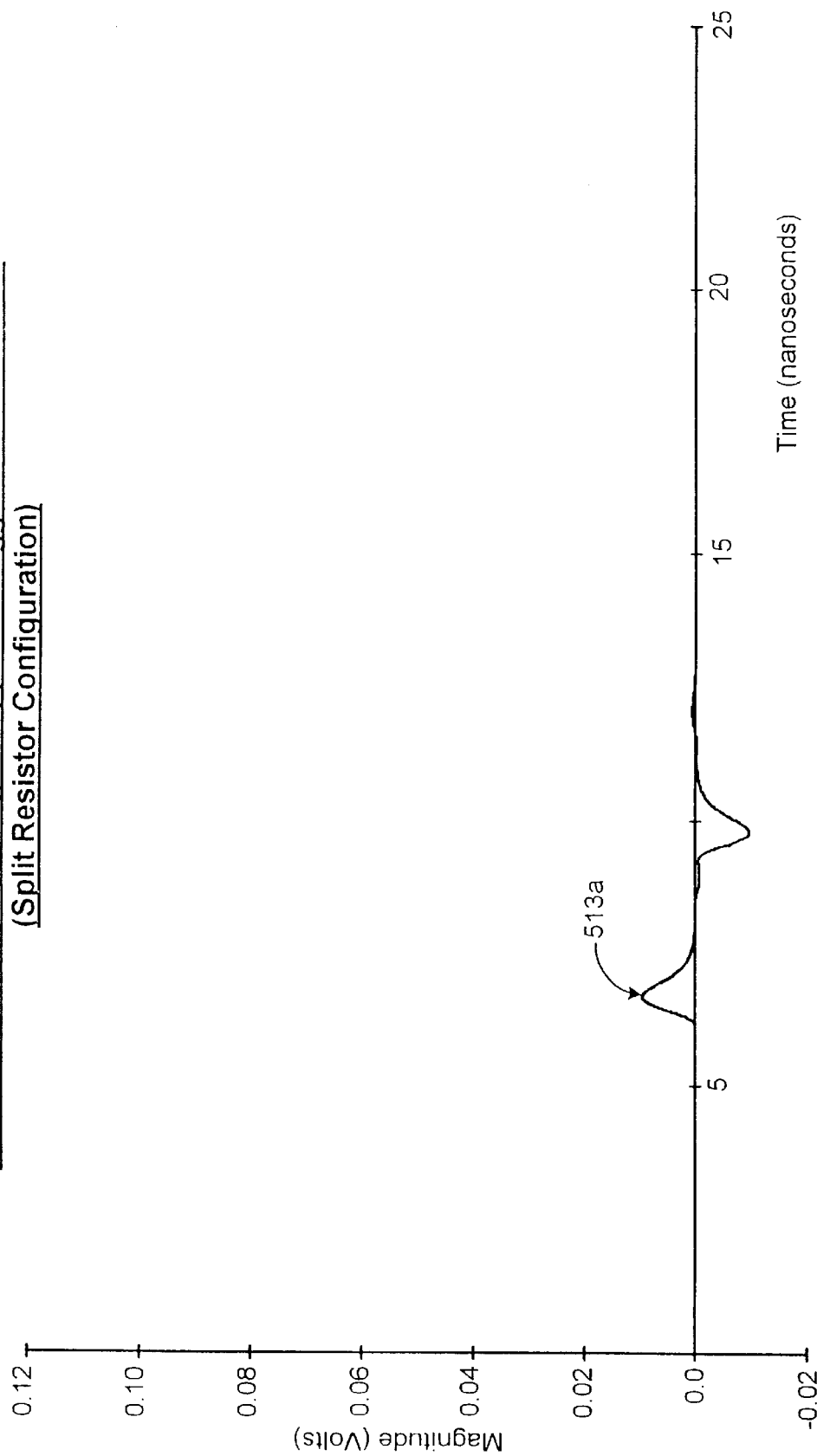

SPLIT RESISTOR PROBE AND METHOD

CROSS-REFERENCE TO RELATED APPLICATIONS

This application is a Continuation Application that is based on and claims priority to U.S. patent application Ser. No. 09/288,347, filed on Apr. 8, 1999, which is incorporated herein by reference. Reference also is made to U.S. patent application entitled "System and Method for Probing Dense Pad Arrays", and accorded Ser. No. 09/288,312, and to U.S. patent application entitled "Process for Assembling an Interposer to Probe Dense Pad Arrays", and accorded Ser. No. 09/288,343, both of which are incorporated herein by reference.

TECHNICAL FIELD

The present invention is generally related to a system and method for testing the operation of integrated and other circuits and, more particularly, is related to a system and method for testing circuits by probing dense pad arrays.

BACKGROUND OF THE INVENTION

Integrated circuits such as processors and other similar devices are operating at much greater speeds to perform an ever increasing number of operations each second. Many of these integrated circuits are placed on printed circuit boards or other similar structures and are in electrical communication with many different electrical components and other integrated circuits resident on the same printed circuit board. In order to facilitate communication between the integrated circuits and the several other electronic components, the integrated Circuit contacts electrical conductors on a printed circuit board through pads that are often arranged in a dense grid or array on the printed circuit board.

Often times, it is necessary to test the operation of such new integrated circuits after they are fabricated either to test prototypes or to diagnose problems experienced with the integrated circuits. In particular, generally one or more of the pads in the array into which the integrated circuit is inserted are probed to access the signal thereon so that the signal can be transmitted to a logic analyzer or oscilloscope. The fact that the pins of the integrated circuits and corresponding pads on the printed circuit board are arranged in a dense array make such testing difficult to accomplish in light of the high frequency operation of such integrated circuits.

To explain further, a typical printed circuit board includes several groups of signal conductors that run between various components on the board. When a probe conductor is joined to one of the pads, a very small capacitance between the probe conductor and the signal conductors on the order of picofarads presents an undesirable load impedance on the pads. In particular, at low frequencies, this impedance is acceptably high. However, at very high signal frequencies, on the order of hundreds of megahertz, the impedance presented by such a capacitance will drop, resulting in extraneous loading on the conductors between the integrated circuits.

In addition, a similar small capacitance may exist between the probe conductor and the remaining pads, or aggressor conductors in the pad array. At high frequencies, these capacitances present a low impedance which results in cross-talk between the aggressor conductors and the probe conductor.

This extraneous loading and cross-talk results in distortion of the signal on the pins of the integrated circuit that causes error to the data represented by the transmitted signals. Consequently, the ability to test the integrated circuit is hampered by the use of the probe itself.

SUMMARY OF THE INVENTION

The present invention provides a system and method for probing target pads in a dense pad array while, first, minimizing distortion of a target signal on the probed pads due to the probe load on the target pads and, second, minimizing distortion of the probe output signal due to cross-talk between the probe tip and aggressor conductors in the dense pad array. In one embodiment, a probe tip arrangement is provided comprising a pad located in a dense pad array and a first probe tip resistor having first and second ends, the first end being coupled to the pad. The first probe tip resistor is positioned directly adjacent to the pad as closely as manufacturing processes will allow.

The probe tip arrangement further includes an access transmission line coupled to the second end of the first probe tip resistor and extending outside of the dense pad array to a second probe tip resistor. The second probe tip resistor is, in turn, coupled to an electrical connector which in turn is coupled to a logic analyzer or oscilloscope to test the signal on the respective pad of the pad array. The dense pad array may be a ball grid array, a pin grid array, an array of vias on a printed circuit board, a number of closely aligned conductors on a printed circuit board or multi-chip module.

The present invention can also be viewed as providing a method for probing a pad in a dense pad array. In this regard, the method can be broadly summarized by the following steps: providing a first end of a first probe tip resistor to a pad in the dense pad array, the first probe tip resistor being directly adjacent to the pad; providing an access transmission line coupled to a second end of the first probe tip resistor and extending outside of the dense pad array; providing a second probe tip resistor coupled to the access transmission line outside of the dense pad array; coupling an external analysis device to the second probe tip resistor; and, analyzing a signal obtained from the pad using the external analysis device.

The present invention has numerous advantages, a few of which are delineated hereafter as merely examples. For instance, the use of the first and second probe tip resistors reduces the incidental loading of the target pads by isolating the target pad from the probe circuitry while at the same time diminishing the effect of cross-talk from nearby aggressor conductors into the probe circuitry. In addition, the present invention is simple in design, user friendly, robust and reliable in operation, efficient in operation, and easily implemented for mass commercial production.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 6A is a graph of a target signal output when the signal input of FIG. 3 is applied to a target conductor in the probe tip arrangement of FIG. 5;

FIG. 8C is a graph of a target signal output when the signal input of FIG. 3 is applied to an aggressor conductor in the probe tip arrangement of FIG. 5;

FIG. 8D is a graph of a probe tip output when the signal input of FIG. 3 is applied to an aggressor conductor in the probe tip arrangement of FIG. 5;

DETAILED DESCRIPTION OF THE INVENTION

Figure 1:
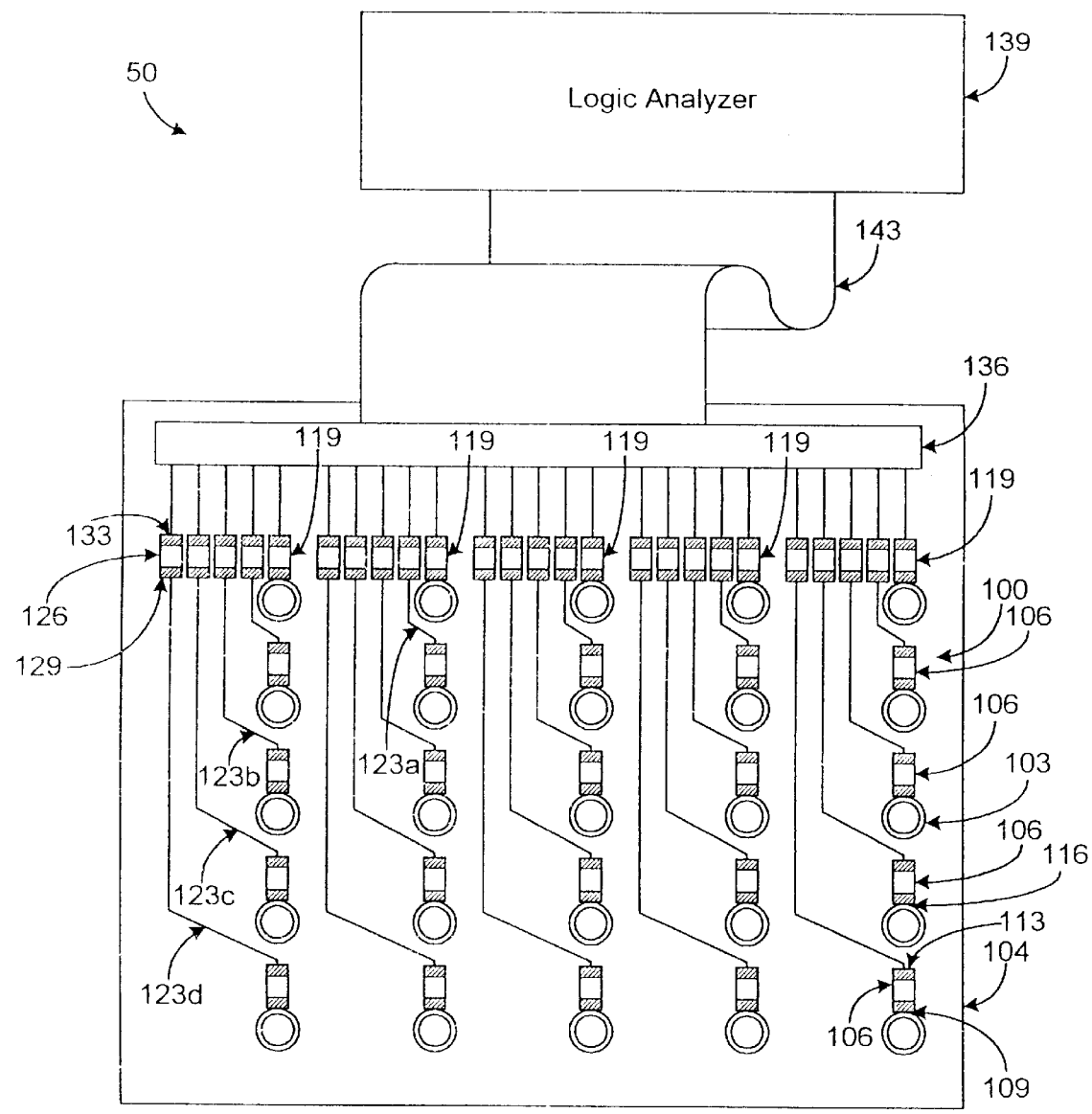
FIG. 1 is a block diagram of a probe system according to an embodiment of the present invention.

Tuning to FIG. 1, shown is a top view of a pad array probing system 50 according to an embodiment of the present invention. The pad array probing system 50 includes a dense pad array 100 which comprises a grid of pads 103 which are conductive holes that extend through a printed circuit board 104 or other similar flat surface member. The pads 103 are generally suited to receive the pins of an integrated circuit or other electronic device. In addition, the dense pad allay 100 may also be a ball grid array, a pin grid array, an array of vias on a printed circuit board, a number of closely aligned conductors on a printed circuit board or multi-chip module. The dense pad array 100 further includes a number of first probe tip resistors 106 which have a first end 109 and a second end 113. The first end 109 of each probe tip resistor 106 is electrically coupled to a respective pad 103, forming a predetermined coupling length 116 between the first ends 109 of the first probe tip resistors 106 and the pads 103, respectively. The predetermined coupling length 116 is as short as possible such that the first probe tip resistors 106 are directly adjacent to the pads 103, which is generally as short as manufacturing line processes will allow. Note that the uppermost pads 103 are coupled to an external probe tip resistor 119 as shown.

The dense pad array 100 further includes a number of transmission lines 123a, 123b, 123c, and 123d. The transmission lines 123a–d are routed from the second ends 113 of the first probe tip resistors 106 out of the dense pad array 100 to a number of second probe tip resistors 126. The second probe tip resistors 126 include a first end 129 and a second end 133. The transmission lines 123a–d are coupled to the first end 129 of the second probe tip resistor 126. The second ends 133 of the second probe tip resistors 126 are electrically coupled to a connector 136 which in turn is electrically coupled to a logic analyzer 139 or oscilloscope (not shown) via a cable 143. Although the transmission lines 123a–d are generally shown exiting the dense pad array 100 in a uniform manner, it is possible that the transmission lines 123a–d follow any particular pathway in any convenient direction out of the dense pad array 100 based on various considerations. For example, it may be preferable to minimize the length of the transmission lines 123a–d to limit interference at high frequencies, or manufacturing limitations may dictate the actual routes employed out of the dense pad array 100. Also, the placement of the pads 103 may limit the possible exit routes for a particular pad 103 out of the dense pad array 100. Additionally, although the transmission lines 123a–d are shown only on the top side of the printed circuit board 104, it is possible that the transmission lines 123a–d be placed on either side of the printed circuit board 104 or a combination thereof using vias which route the transmission lines 123a–d through the printed circuit board 104.

The functionality of the dense pad array 100 is as follows. An integrated circuit such as a processor may have several pins which are generally lodged into each pad 103 in the pad array 100. The pads 103 are also electrically coupled to other integrated circuits and various components on the printed circuit board 104. Signals propagate between the integrated circuit attached to the pad arrays 100 and other components on the printed circuit board 104 during the operation of the overall circuit on the printed circuit board 104.

The first probe tip resistors 106, transmission lines 123a–d, and second probe tip resistors 126 are employed to access the signals propagated on the pads 103 of the dense pad arrays 100 in order to test the operation of the integrated circuit attached to the dense pad arrays 100. Note that the first and second probe tip resistors 106 and 126 are called "probe tip" resistors because they are located at the tip of what is considered a probe applied to each of the pads 103. In particular, a signal propagated on the pads 103 is also transmitted through the first probe tip resistors 106, along the transmission lines 123a–d, and through the second probe tip resistors 126 to the logic analyzing device 139 or other similar diagnostic equipment. The placement of the first probe tip resistors 106 with their first ends 109 as close as possible to the pads 103 reduces the loading of the pads 103 which would otherwise occur if there were no probe tip resistor 106 coupling the transmission lines 123a–d to the respective pads 103 within the dense pad array 100. The same is true regarding the external probe tip resistors 119 in which the electrical coupling to the connector 139 may cause the loading of the respective pads 103 to which the external probe tip resistors 119 are coupled. In addition, the second probe tip resistors 126 are coupled to the transmission lines 123a–d at a point outside of the dense pad array 100 to reduce the effects of cross-talk between the pads 103 and the transmission lines 1223a–d due to a capacitance between any one of the pads 103 and a transmission line 1223a–d which is routed near the respective pad 103. These pads 103 which are close to the transmission lines 123a–d are called aggressor conductors as will be discussed herein. These concepts warrant further explanation.

Figure 2:
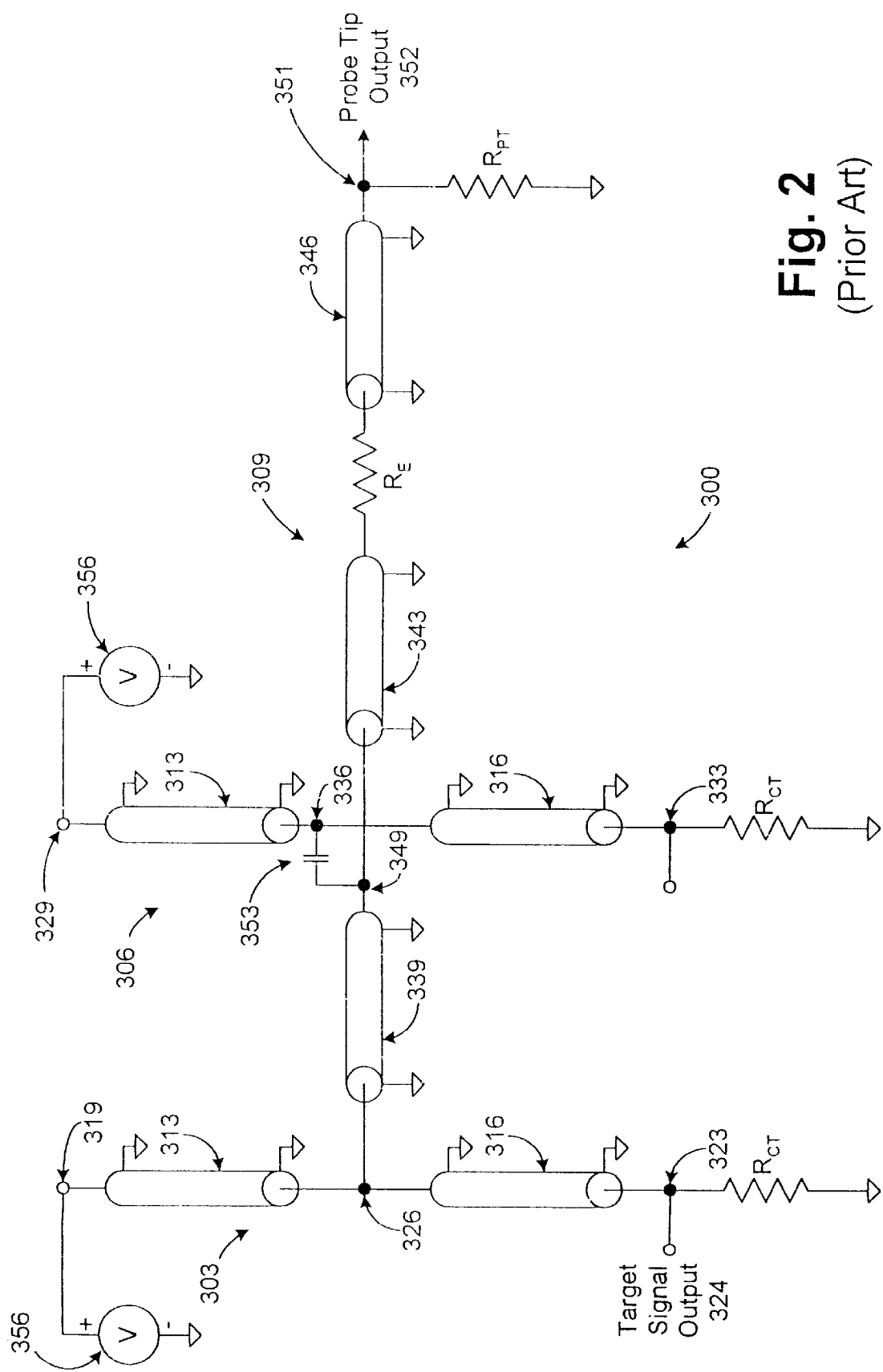
FIG. 2 is a schematic of a probe tip arrangement according to the prior art.

To discuss these concepts further, reference is made to FIG. 2 which is a simplified schematic of a probe tip arrangement 300 according to the prior art. The probe tip arrangement 300 includes a target conductor 303, all aggressor conductor 306, and a probe tip 309. The target and aggressor conductors 303 and 306 actually are comprised of a pin from an integrated circuit, a pad 103 into which the pins are inserted, and the printed circuit board traces, driving elements, and termination resistors coupled to the pads 103. The target and aggressor conductors 303 and 306 include first and second transmission lines 313 and 316 and a conductor termination resistance $R_{CT}$ of approximately 50 Ohms. In the target conductor 303, the first and second transmission lines 313 and 316 couple a target node 319 to a target output node 323 from which a target output signal 324 may be obtained. Between the first and second transmission lines 313 and 316 of the target conductor 303 is a contact node 326. In the aggressor conductor 306, the first and second transmission lines 313 and 316 couple an aggressor node 329 to an aggressor output node 333. Between the first and second transmission lines 313 and 316 of the aggressor conductor 306 is a aggressor contact node 336. The first and second transmission lines 313 and 316 both have a characteristic impedance $Z_0$=50 Ohms with a propagation delay $T_d$=1 nanosecond, which are parameters understood by those skilled in the art and not discussed in detail herein.

The probe tip 309 includes the contact node 326, a first probe transmission line 339, a second probe transmission line 343, an external probe tip resistor $R_E$, and an external probe transmission line 346. The first probe transmission line 339 couples the contact node 326 to an intermediate node 349 and the second probe transmission line 343 couples the intermediate node 349 to the external probe tip resistor $R_E$. The external probe tip resistor $R_E$ is coupled to a probe tip output node 351 via the external probe transmission line 346. A probe tip output signal 352 is obtained from the probe tip output node 351. The probe tip output node 351 is coupled to a probe termination resistor $R_{PT}$ of approximately 75 Ohms which matches the characteristic impedance of the external probe transmission line 346. A coupling capacitor 353 couples the aggressor contact node 336 to the intermediate node 349. The coupling capacitor 353 is actually a parasitic capacitance which exists due to the fact that the aggressor conductor 306 is in close proximity to the probe tip 309.

The first probe transmission line 339 and the second probe transmission line 343 have a characteristic impedance of approximately 75 Ohms and a propagation delay of approximately 50 picoseconds. The external probe transmission line 346 has a characteristic impedance of approximately 75 Ohms and a propagation delay of approximately 5 nanoseconds. The external probe tip resistor $R_E$ may have a resistance value of approximately 675 Ohms and the coupling capacitor 353 may have a value of approximately 0.3 picofarads. It is understood, however, that the above state approximate values for the characteristic impedances, propagation delays, and resistances above and disclosed hereafter are used for purposes of illustrating the present invention and that they may vary as these values are application specific.

During operation of the probe tip arrangement 300, a voltage source V with a zero source impedance is applied to both the target node 319 and the aggressor node 329. The signal input may also originate from another point along the target and aggressor conductors 303 and 306, although for purposes of the following explanation, the signal input 356 that emanates from the voltage source V is applied to the target and aggressor nodes 319 and 329 as is discussed in the following, text. Note that the aggressor conductor 306 is representative of the multiple aggressor conductors or other conductors which may be in close proximity to the probe tip 309.

The probe arrangement 300 provides an illustration of the loading of the target conductors 303 which include the pads 103 (FIG. 1) which occurs due to the application of the probe tip 309 to the target conductor 303 in the dense pad array 100 (FIG. 1). In particular, when the probe tip is applied to the contact node 326, the first and second probe transmission lines 339 and 343 add capacitance to the target conductor 303 due to the proximity of the probe tip 309 to any ground plane (not shown) or other conductive pathway such as is the case with the aggressor conductor 306. At high frequencies, the impedance of the capacitor 353 and the capacitances of the transmission lines 339 and 343 are very low, causing a loading on the target conductor 303 which results in distortion of the signal input 356 as it travels through the target conductor 303.

The probe arrangement 300 also provides an illustration of the effects of cross-talk between the aggressor conductor 303 and the probe tip 309. In particular, at high frequencies, the signal input 356 applied to the aggressor node 329 is transmitted through the capacitor 353 onto the probe tip 309, resulting in cross-talk that may distort the signals delivered to the logic analyzer 139 or other analysis equipment.

Figure 3:
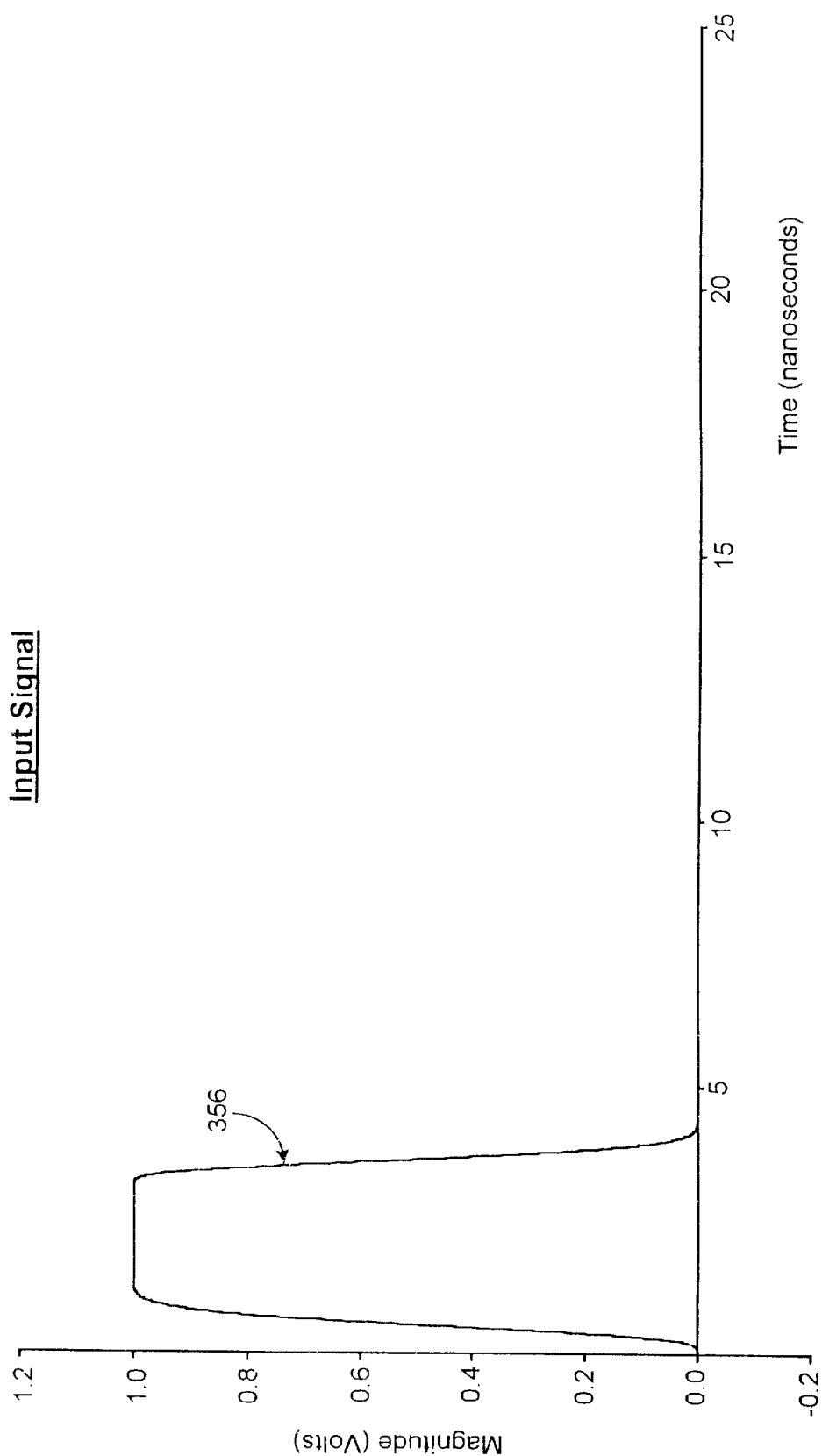
FIG. 3 is a graph of signal input applied to the probe tip arrangement of FIGS. 2, 5, and 7.
Figure 4A:
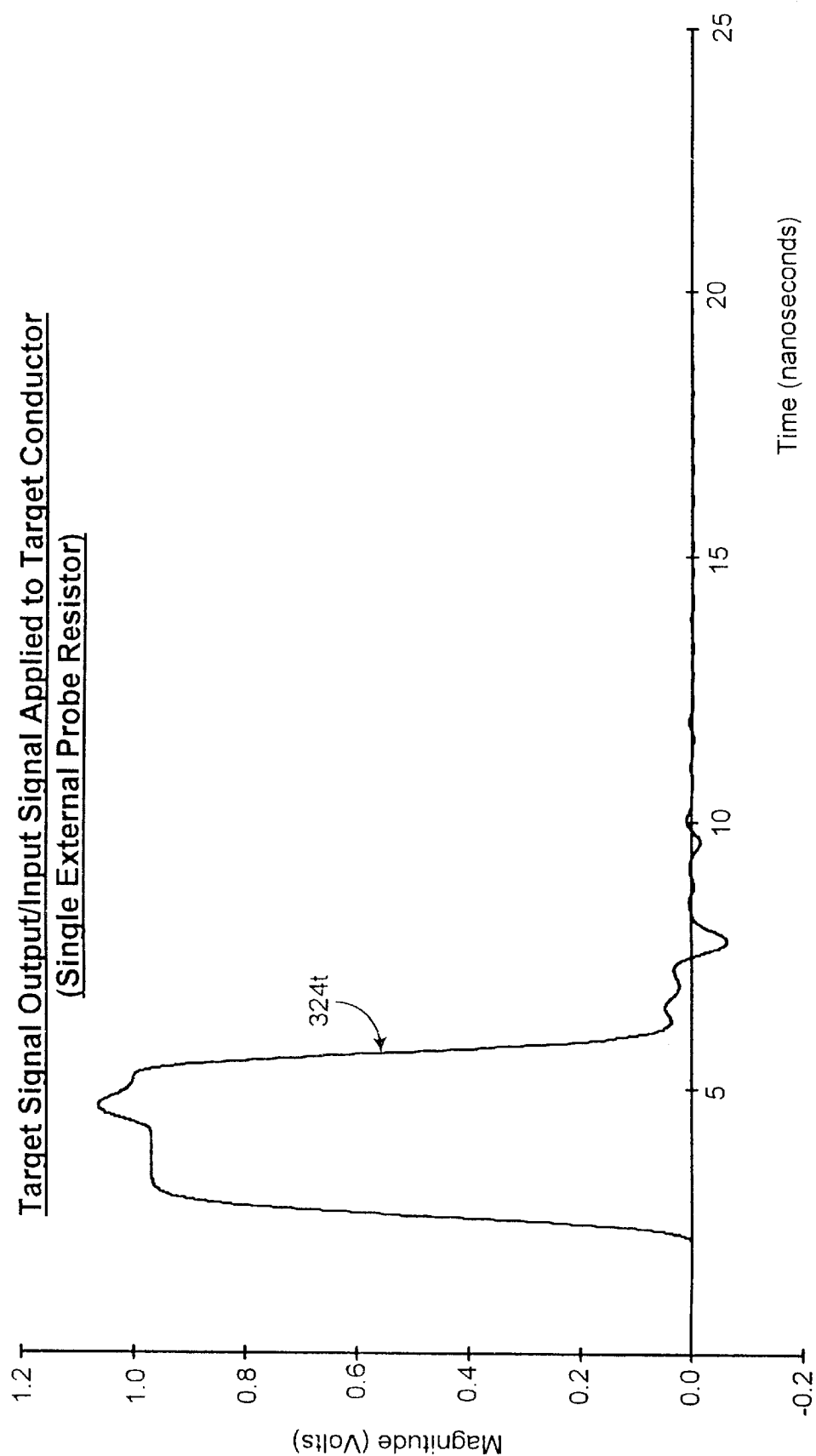
FIG. 4A is a graph of a target signal output when the signal input of FIG. 3 is applied to a target conductor in the probe tip arrangement of FIG. 2.
Figure 4B:
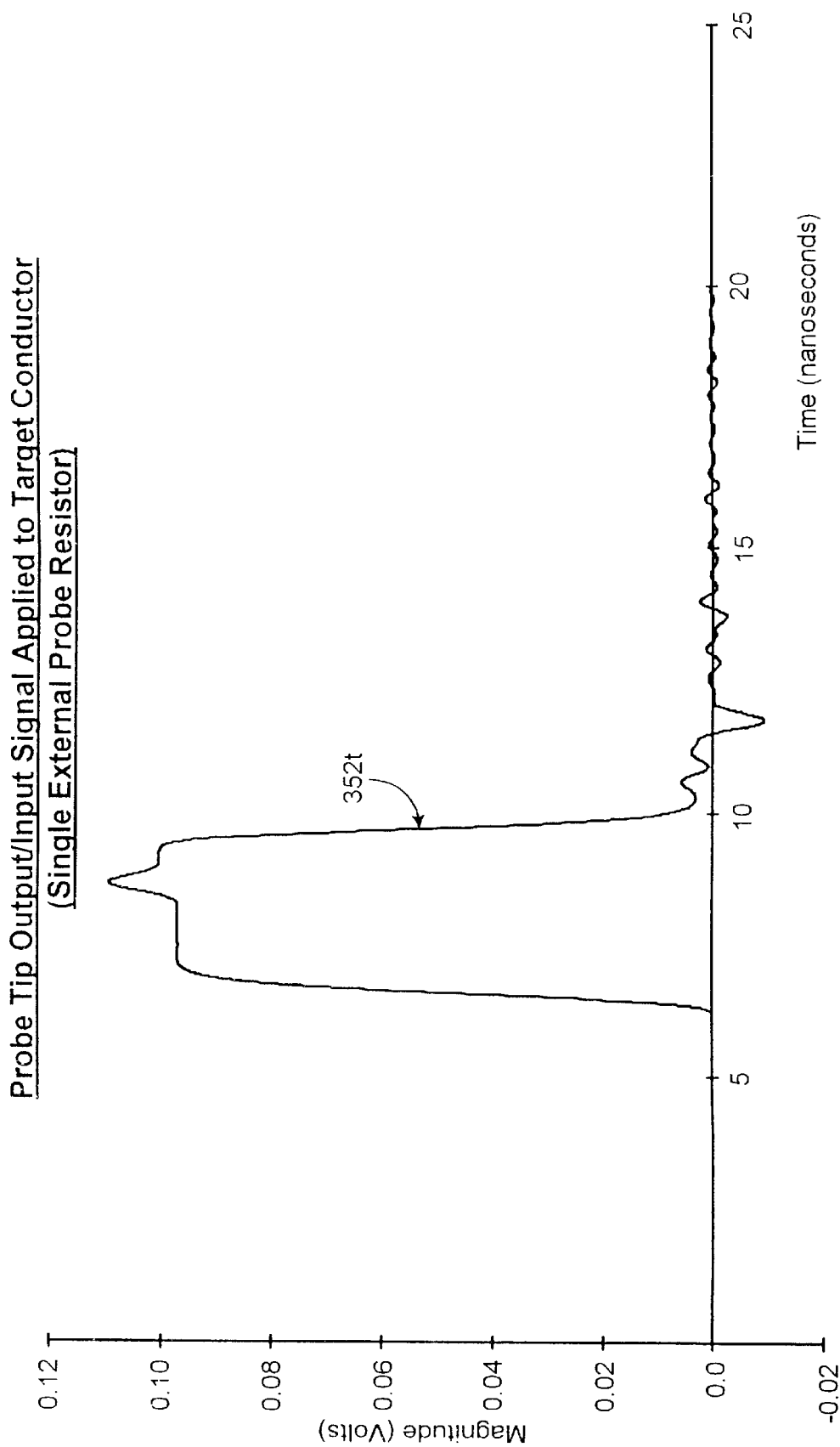
FIG. 4B is a graph of a probe tip output when the signal input of FIG. 3 is applied to a target conductor in the probe tip arrangement of FIG. 2.
Figure 4C:
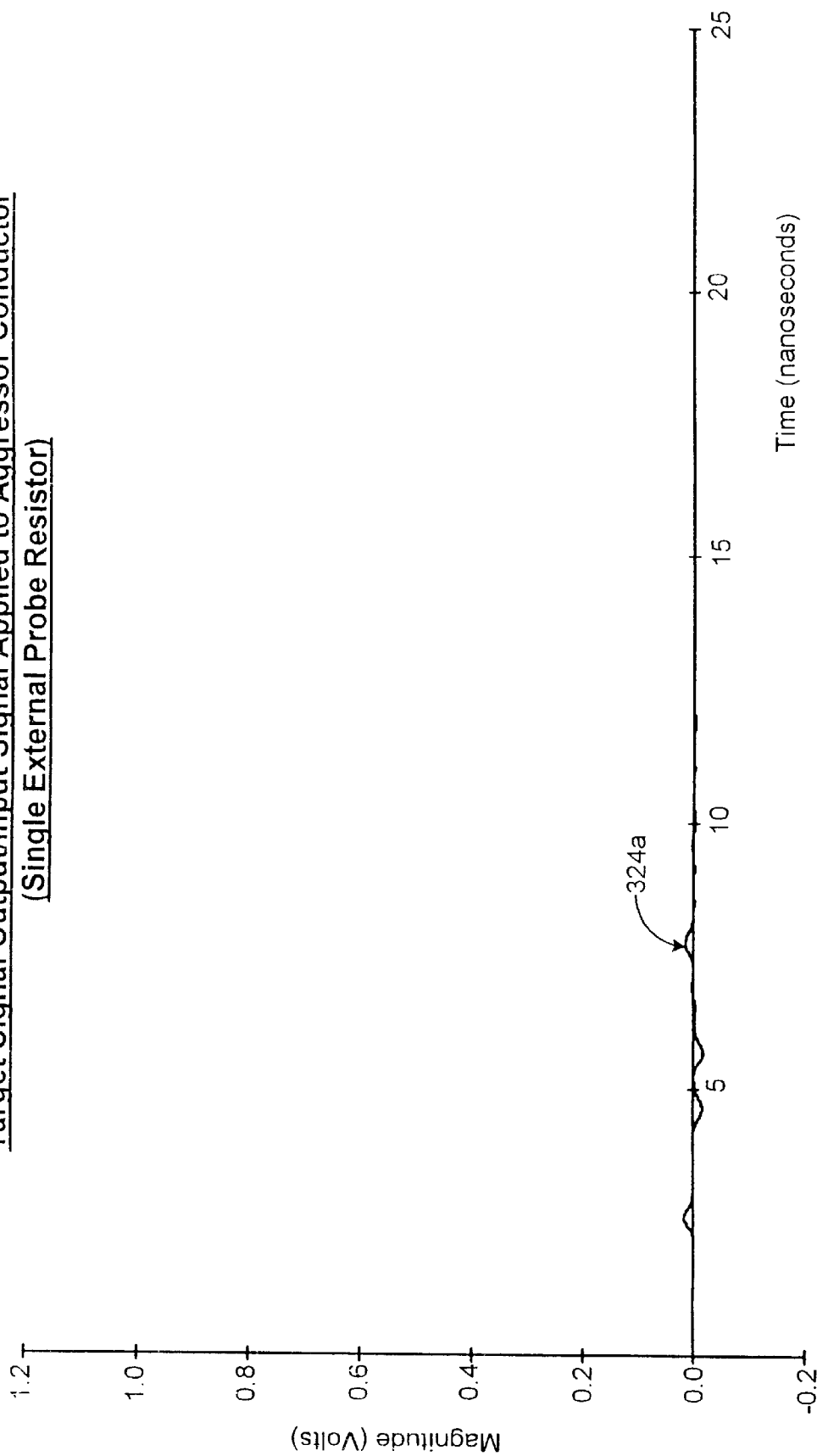
FIG. 4C is a graph of a target signal output when the signal input of FIG. 3 is applied to an aggressor conductor in the probe tip arrangement of FIG. 2.
Figure 4D:
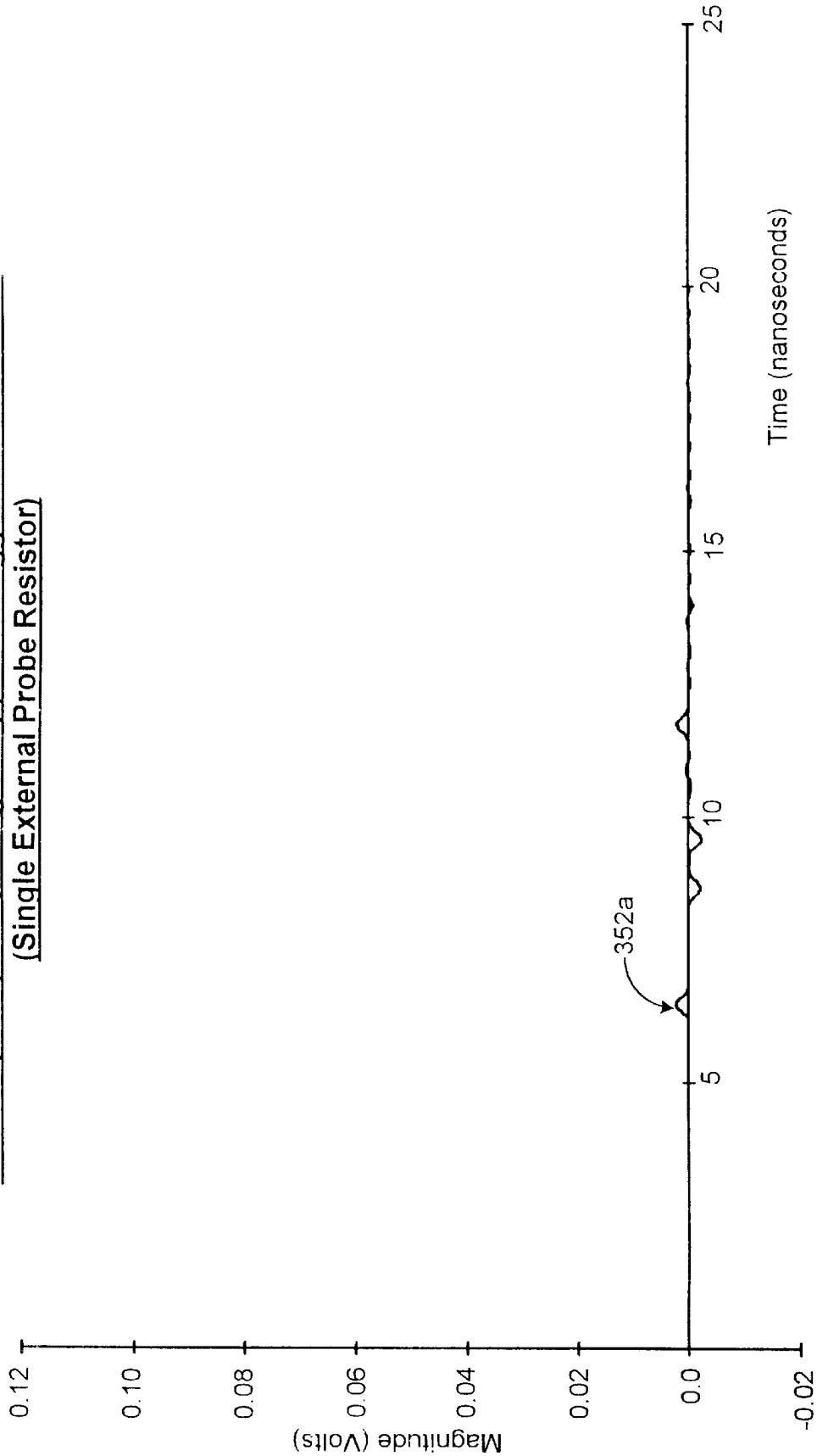
FIG. 4D is a graph of a probe tip output when the signal input of FIG. 3 is applied to an aggressor conductor in the probe tip arrangement of FIG. 2.

Turning then, to FIG. 3, shown is a graph of the signal input 356 which is applied at either the target node 319 or the aggressor node 329 to determine the various signal outputs as discussed in the following text. FIG. 4A shows a graph of the target signal output 324t at the target output node 323 (FIG. 2) and FIG. 4B shows the probe tip output 352t at the probe tip output node 351 given the application of the signal input 356 to the target node 319 while the aggressor node 329 is held constant at 0 Volts. As is seen, the loading of the target conductor 303 due to the probe tip 309 results in distortion to the waveform as compared to the signal input 356 as shown. In addition, FIG. 4C shows a graph of the target signal output 324a and FIG. 4D the probe tip output 352a which results from the application of the signal input 356 to the aggressor node 306 while the target node 319 is held constant at 0 Volts, due to cross-talk as discussed previously. The resulting, target signal output 324a and probe tip output 352a add directly to the desired signals sought at both points resulting in distortion.

Figure 5:
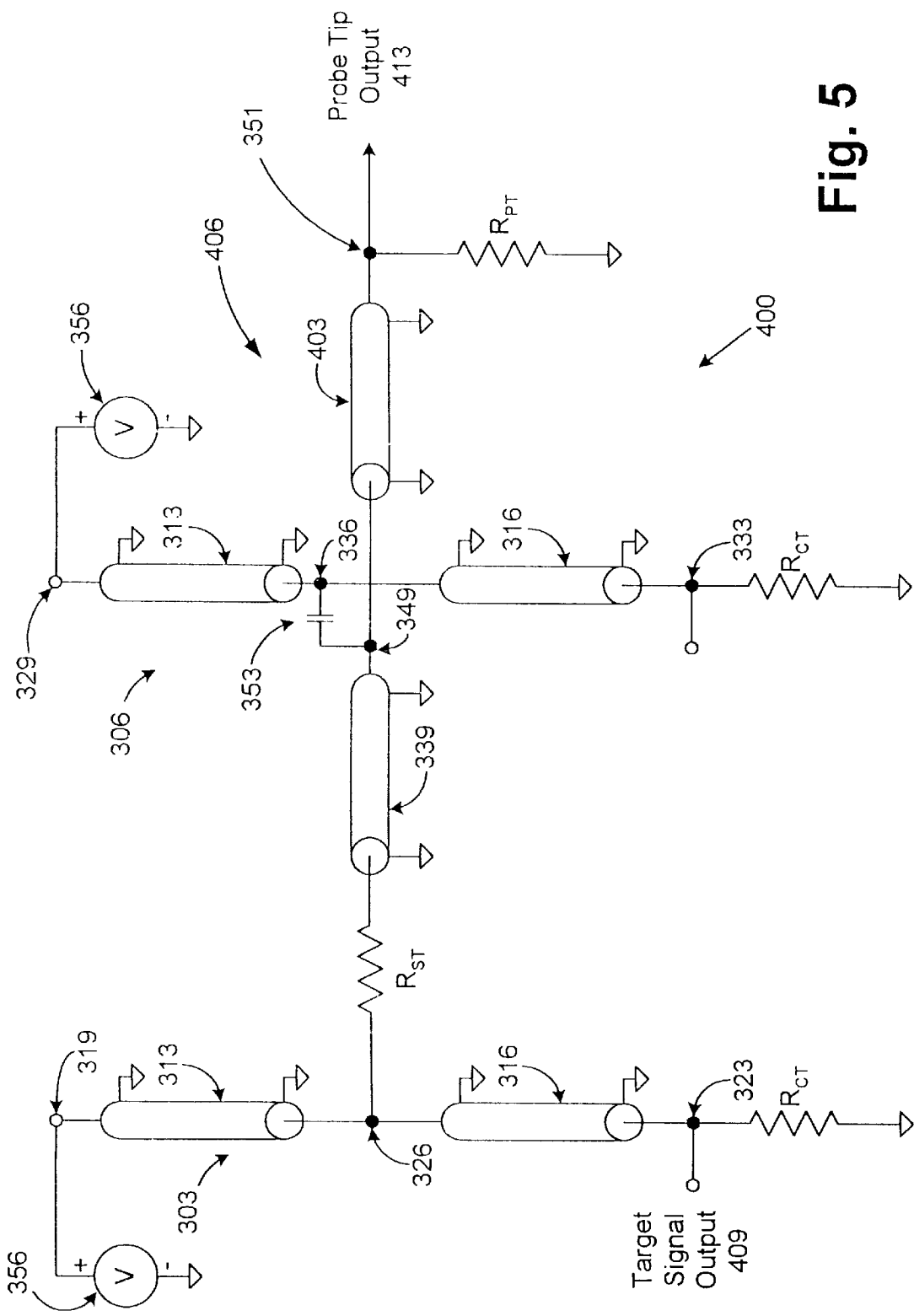
FIG. 5 is a schematic of a second probe tip arrangement.

With reference to FIG. 5, shown is another possible probe tip arrangement 400. The probe tip arrangement 400 differs from the probe tip arrangement 300 (FIG. 2) in that a single probe tip resistor $R_{ST}$ is inserted between the contact node 326 and the first probe transmission line 339, and, that a single probe transmission line 403 replaces the second probe transmission line 343 (FIG. 2), external probe tip resistor $R_E$ (FIG. 2), and the external probe transmission line 346 (FIG. 2), forming a probe tip 406. The probe tip 406 has a target signal output 409 at the target output node 323 and a corresponding probe tip output 413 at the probe tip output node 351. The resistance value of the single probe tip resistor $R_{ST}$ is approximately equal to 675 Ohms, although other resistance values may be used depending upon the particular application. The single probe transmission line 403 has a characteristic impedance of approximately 75 Ohms and a propagation delay of approximately 5.05 nanoseconds. Once again, these values are disclosed herein to illustrate the present invention and may vary significantly, depending upon the particular application.

Figure 6B:
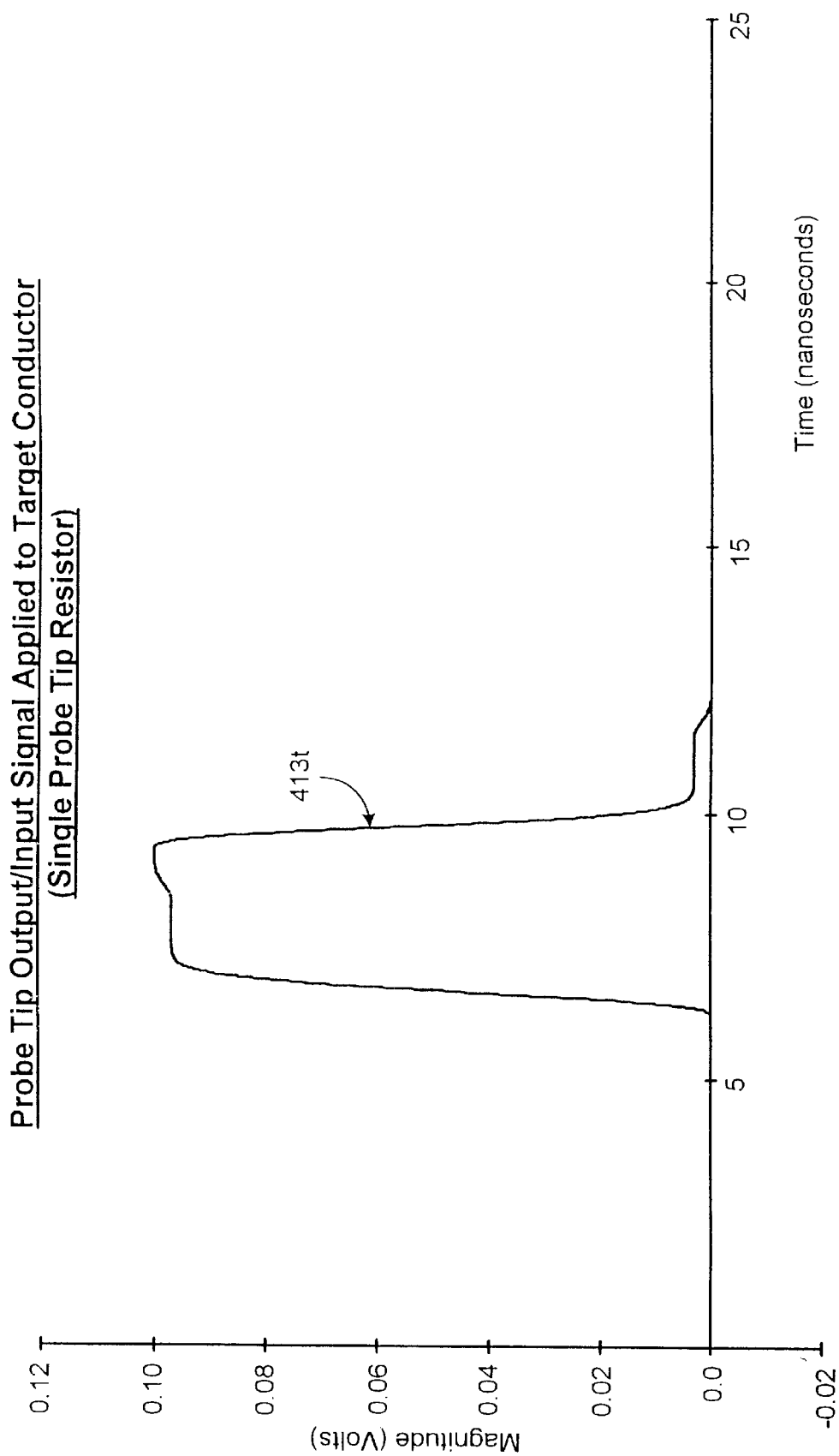
FIG. 6B is a graph of a probe tip output when the signal input of FIG. 3 is applied to a target conductor in the probe tip arrangement of FIG. 5.

Referring to FIG. 6A, shown is a chart of the target signal output 409t which results from the application of the signal input 356 (FIG. 3) to the target node 319 (FIG. 5). Thus, it is seen that the single probe tip resistor $R_{ST}$ reduces the loading of the target conductor 303 or isolates the target conductor 303 from the capacitive load of the probe tip 406, although it is inevitable that some distortion may occur. With reference to FIG. 6B, shown is the corresponding probe tip output 413t which indicates that the isolation provided by the single probe tip resistor $R_{ST}$ results in lesser distortion in the probe tip output 413t as well.

Figure 6C:
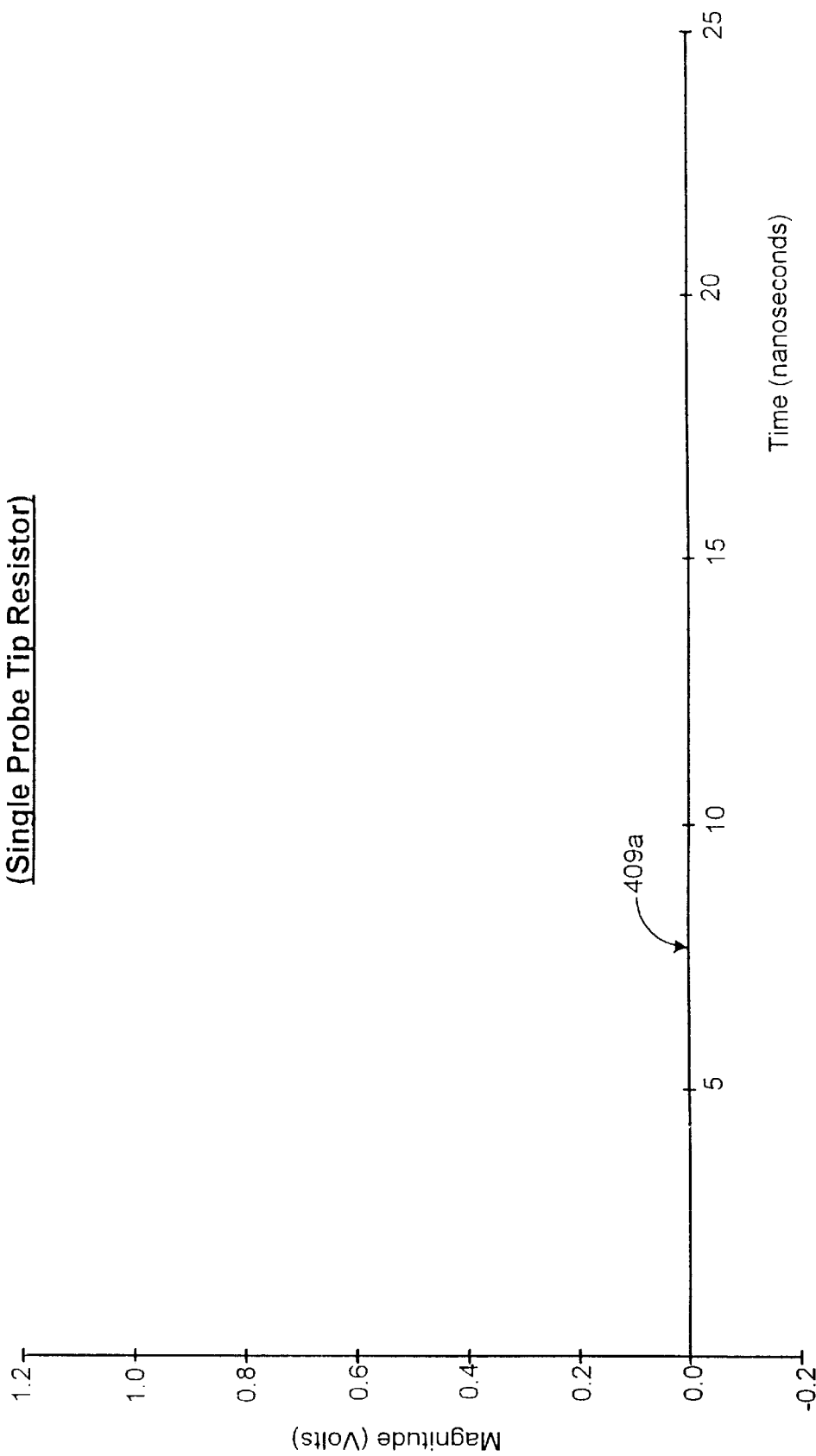
FIG. 6C is a graph of a target signal output when the signal input of FIG. 3 is applied to an aggressor conductor in the probe tip arrangement of FIG. 5.
Figure 6D:
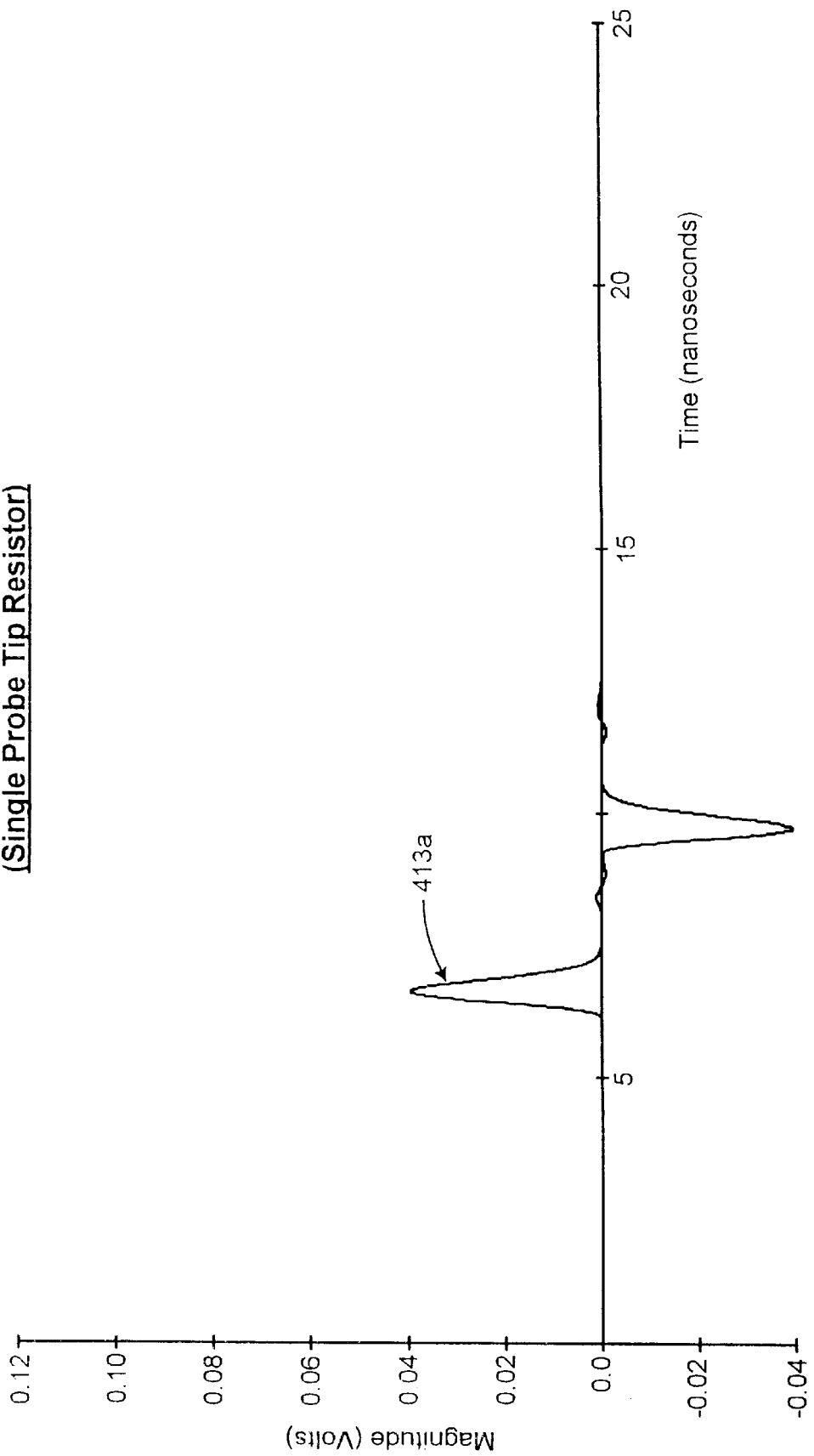
FIG. 6D is a graph of a probe tip output when the signal input of FIG. 3 is applied to an aggressor conductor in the probe tip arrangement of FIG. 5.

Turning then, to FIG. 6C, shown is the target signal output 409a which occurs upon the application of the signal input 356 (FIG. 3) to the aggressor node 329 (FIG. 5). As expected, the magnitude of the target signal output 409a is minimal due to the apparent barrier provided by the single probe tip resistor $R_{ST}$. Referring to FIG. 6D, however, a significant corresponding probe signal output 413a is seen. Consequently, the placement of the single probe tip resistor $R_{ST}$ results in a probe signal output 413a or cross-talk which would interfere with any desired signal one wishes to obtain for analysis using the probe tip arrangement 400. The distortion due to cross-talk is more pronounced due to the fact that the cross-talk portion of the probe signal output 413a is not attenuated by the single probe tip resistor $R_{ST}$, so a signal at the contact node 326 that is detected at the probe tip output 413 is smaller in comparison to the cross-talk, resulting in significant signal distortion.

Figure 7:
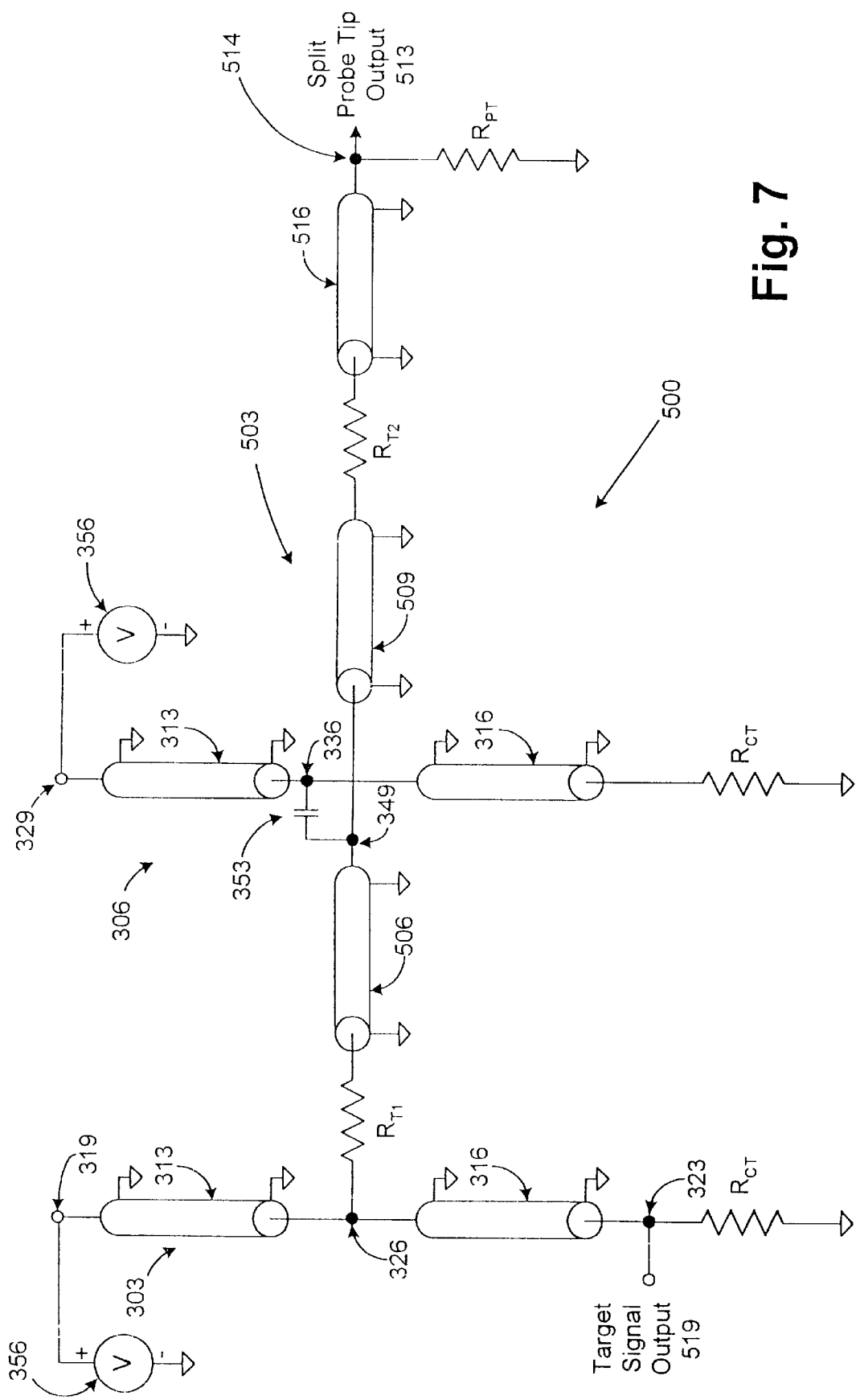
FIG. 7 is a schematic of a probe tip arrangement according to an embodiment of the present invention.

Turning to FIG. 7, shown is a split probe tip arrangement 500 according to an embodiment of the present invention. The split probe tip arrangement 500 includes a target conductor 303 and an aggressor conductor 306 similar to the probe tip arrangements 300 (FIG. 2) and 400 (FIG. 5) discussed previously. However, the split probe tip arrangement 500 includes a split probe tip 503 with a first probe resistor $R_{T1}$ coupled to the contact node 326 and a first probe transmission line 506. The first probe transmission line 506 couples the first probe resistor $R_{T1}$ to the intermediate node 349. A second probe transmission line 509 couples the intermediate node 349 to a second probe resistor $R_{T2}$. A split probe signal output 513 is obtained from a split probe output node 514 which is coupled to the second probe resistor $R_{T2}$ via a third probe transmission line 516. Also, a target signal output 519 is obtained at the target output node 323.

The values of the first and second probe resistors $R_{T1}$ and $R_{T2}$ are approximately equal to 200 Ohms and 475 Ohms, respectively. The first and second probe transmission lines 506 and 509 have a characteristic impedance of approximately 75 Ohms with a propagation delay of approximately 50 picoseconds, and the third probe transmission line 516 has an approximate characteristic impedance of 75 Ohms with an approximate propagation delay of 5 nanoseconds. The probe termination resistor $R_{PT}$ has a resistance value of approximately 75 Ohms. As stated previously, the above parameters are chosen to illustrate the present invention and may vary depending upon the particular application.

Figure 8A:
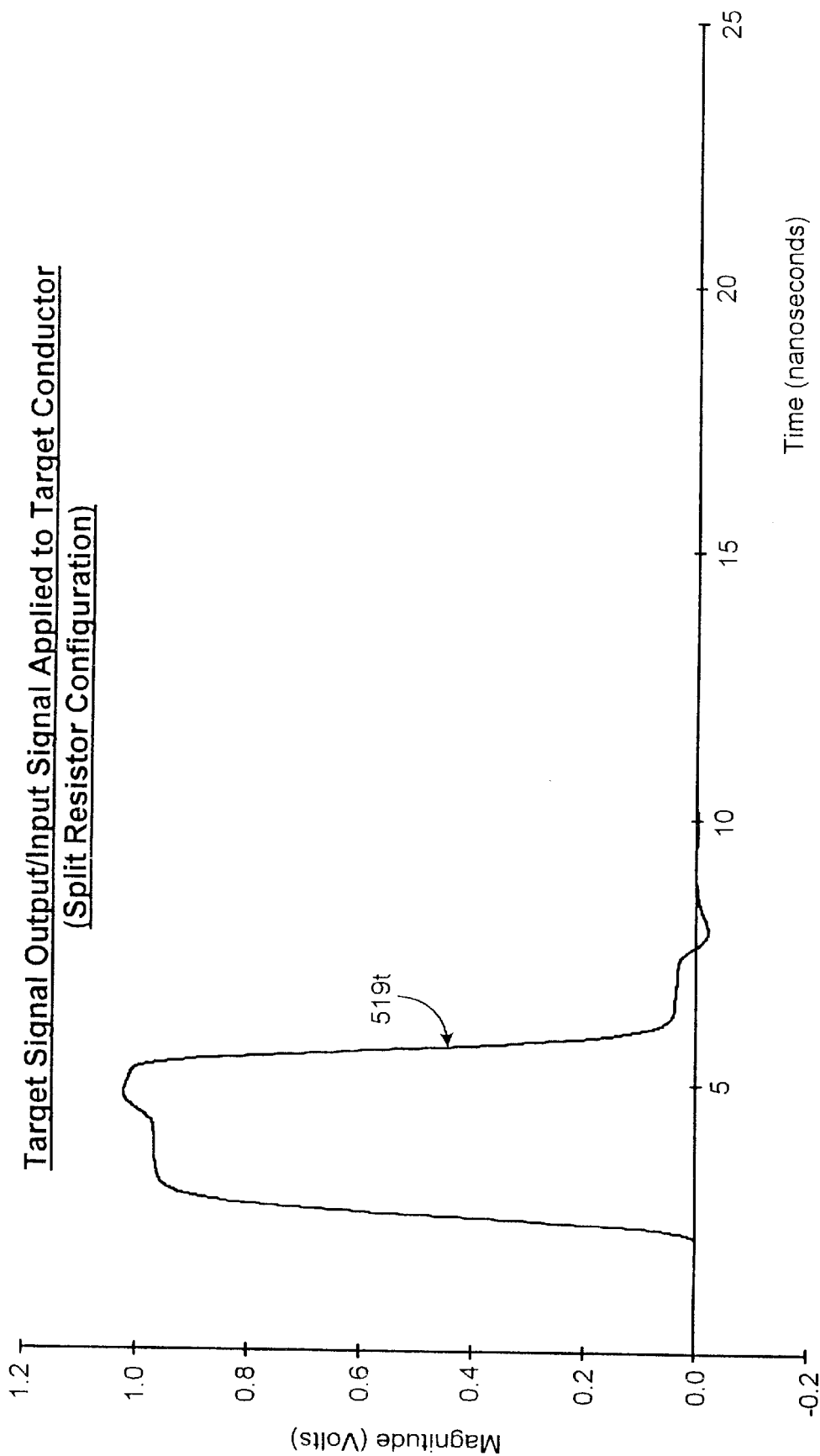
FIG. 8A is a graph of a target signal output when the signal input of FIG. 3 is applied to a target conductor in the probe tip arrangement of FIG. 5.
Figure 8B:
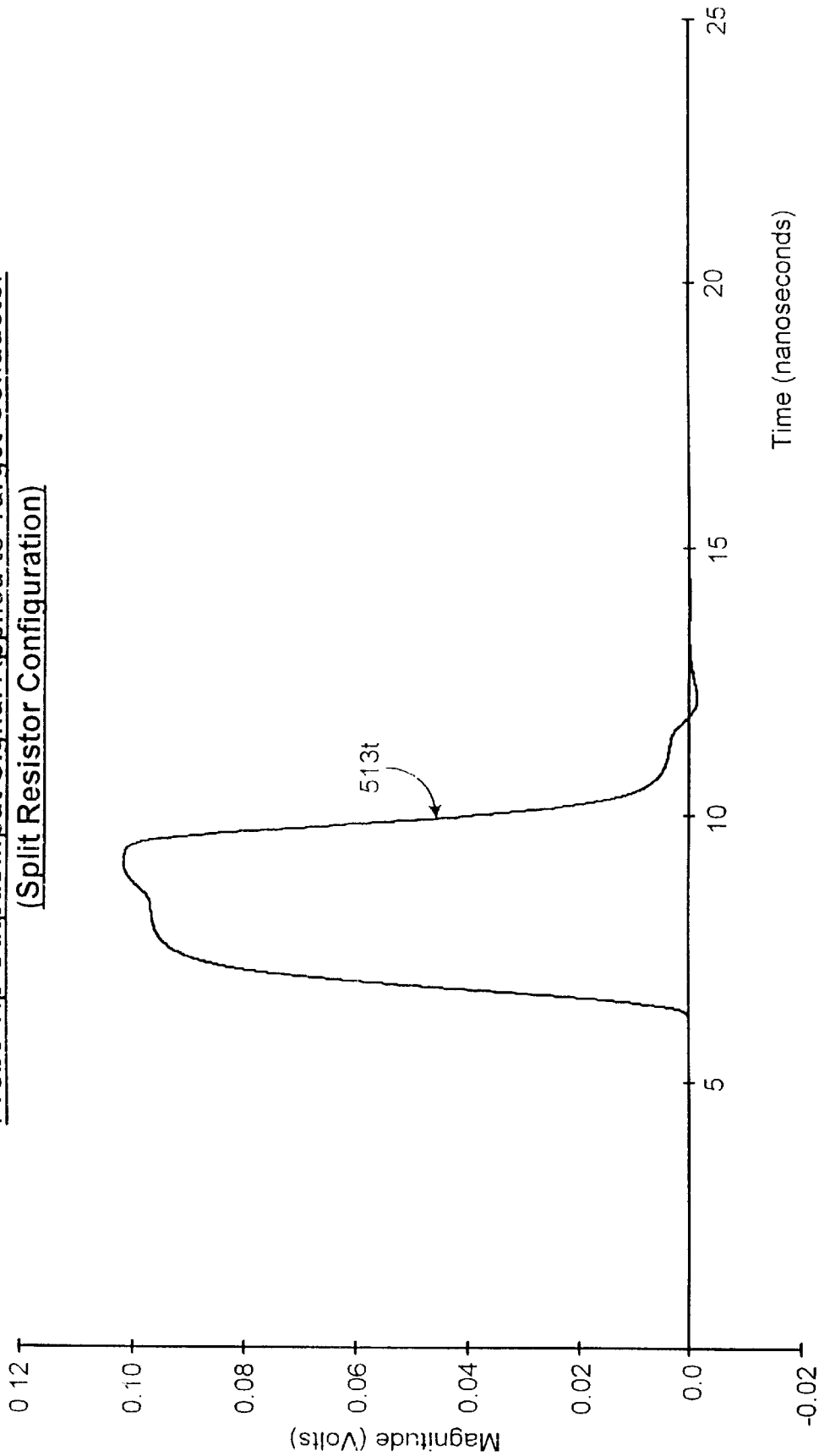
FIG. 8B is a graph of a probe tip output when the signal input of FIG. 3 is applied to a target conductor in the probe tip arrangement of FIG. 5.

Turning to FIG. 8A, shown is a graph of the target signal output 519t resulting from the application of the signal input 356 (FIG. 3) to the target node 319 (FIG. 7). As seen, the first probe resistor $R_{T1}$ significantly reduces loading of the target conductor 303 due to the minimal distortion experienced. With reference to FIG. 8B, shown is a corresponding graph of the probe tip output 513t which also indicates reduced distortion due to minimized loading of the target conductor 303. Also, referring to FIGS. 8C and 8D, shown are the target signal output 519a and the probe tip output 513a that result from the application of the signal input 356 (FIG. 3) to the aggressor node 329 (FIG. 7). Both the target signal output 519a and the probe tip output 513a are minimal which indicates diminished distortion due to cross-talk.

Referring back to FIG. 7, the resistance values of the first and second probe resistors $R_{T1}$ and $R_{T2}$ are specified in light of a couple of factors. First, the overall series resistance presented by the combination of the first and second probe resistors $R_{T1}$ and $R_{T2}$ should not be too high so as to diminish the magnitude of the signal input 356 at the split probe tip output 513 beyond a detectable level. Also, the overall series resistance should not be so high as to filter out the significant high frequency components of the input signal. On the other hand, the same resistance values should not be too low so as to result in undesirable loading of the target conductor 303. Other factors to consider is the acceptable signal distortion allowed on both the target conductor 303 (FIG. 2) and in the signal received by the logical analyzing equipment 139 (FIG. 1). Thus, one may determine the actual values using an iterative process with these factors in mind.

The actual resistance values of the first and second probe resistors $R_{T1}$ and $R_{T2}$ may also depend upon other factors such as the particular density of the dense pad array 100 (FIG. 1). In particular, a more dense array may be subject to greater cross-talk problems as opposed to less dense arrays. Also, lower character impedance conductors 303 and 306 are less sensitive to the probe loading. Consequently, the values of the first and second probe resistors $R_{T1}$ and $R_{T2}$ may vary depending upon the specific application.

Many variations and modifications may be made to the above-described embodiment(s) of the invention without departing substantially from the spirit and principles of the invention. All such modifications and variations are intended to be included herein within the scope of the present invention.

What is claimed is:

1. A system for testing an integrated circuit, comprising:
   a dense pad array having a first pad;
   a probe tip arrangement coupled to the first pad, the probe tip arrangement having a first probe tip resistor, an access transmission line, and a second probe tip resistor, the first probe tip resistor being adjacent to the first pad, the first probe tip resistor having a first end, a second end, and a first resistance, the first end of the first probe tip resistor being coupled to the first pad, the access transmission line being coupled to the second end of the first probe tip resistor, the access transmission line extending outside of the dense pad array, the second probe tip resistor being arranged outside the dense pad array and being coupled to the access transmission line, the second probe tip resistor having a second resistance, the first resistance and second resistance being configured to reduce conductor loading on the first pad.

2. The system of claim 1, wherein the probe tip arrangement has at least one aggressor conductor located in close proximity to the access transmission line, and wherein a predefined capacitance is created between the aggressor conductor and the access transmission line.

3. The system of claim 1, further comprising:
a logic analyzer configured to receive a signal from an integrated circuit engaged with the dense pad array, the logic analyzer electrically communicating with the second probe tip resistor.

4. The system of claim 1, further comprising:
an oscilloscope configured to receive a signal from an integrated circuit engaged with the dense pad array, the oscilloscope electrically communicating with the second probe tip resistor.

5. The system of claim 2, wherein the first resistance and second resistance are configured to reduce cross-talk between the aggressor conductor and the access transmission line.

6. The system of claim 2, wherein a coupling length between the first probe tip resistor and the first pad is less than a distance between the first pad and a nearest aggressor conductor in the dense pad array.

7. A method for testing an integrated circuit, comprising the steps of:
providing a first end of a first probe tip resistor coupled to a first pad in a dense pad array;
providing an access transmission line coupled to a second end of the first probe tip resistor and extending outside of the dense pad array;
providing a second probe tip resistor coupled to the access transmission line outside of the dense pad array;
electrically coupling an external analysis device to the second probe tip resistor;
electrically engaging a pad of an integrated circuit with the first pad of the dense pad array; and
analyzing a signal obtained from the first pad using the external analysis device,
wherein the first resistance and second resistance are configured to reduce conductor loading on the first pad.

8. The method claim 7, wherein the step of providing an access transmission line comprises the step of providing at least one aggressor conductor located in close proximity to the access transmission line, and wherein a predefined capacitance is created between the aggressor conductor and the access transmission line.

9. The method claim 8, wherein the step of providing a first end of a first probe tip resistor comprises the step of providing a coupling length between the first probe tip resistor and the first pad that is less than a distance between the first pad and a nearest aggressor conductor in the dense pad array.

10. The method claim 8, wherein the step of providing a first end of a first probe tip resistor comprises the step of configuring the first resistance and second resistance to minimize an amount of cross-talk between the aggressor conductor and the access transmission line.

11. A method for testing an integrated circuit, comprising the steps of:
providing a dense pad array and a probe tip arrangement, the dense pad array having a first pad, the probe tip arrangement being coupled to the first pad, the probe tip arrangement being configured to reduce conductor loading on the first pad;
electrically engaging a pad of an integrated circuit with the first pad of the dense pad array;
providing an external analysis device for analyzing a signal corresponding to the integrated circuit; and
analyzing a signal obtained from the first pad using the external analysis device.

12. The method of claim 11, wherein the step of providing a dense pad array and a probe tip arrangement comprises the steps of:
providing a first end of a first probe tip resistor to a first pad in a dense pad array;
providing an access transmission line coupled to a second end of the first probe tip resistor and extending outside of the dense pad array;
providing a second probe tip resistor coupled to the access transmission line outside of the dense pad array.

13. The method of claim 12, wherein the step of providing an external analysis device comprises the step of electrically coupling the external analysis device to the second probe tip resistor.

14. The method claim 12, wherein the step of providing an access transmission line comprises the step of providing at least one aggressor conductor located in close proximity to the access transmission line, and wherein a predefined capacitance is created between the aggressor conductor and the access transmission line.

15. The method claim 12, wherein the step of providing a first end of a first probe tip resistor comprises the step of providing a coupling length between the first probe tip resistor and the first pad that is less than a distance between the first pad and a nearest aggressor conductor in the dense pad array.

16. The method claim 12, wherein the step of providing a first end of a first probe tip resistor comprises the step of configuring the first resistance and second resistance to minimize an amount of cross-talk between the aggressor conductor and the access transmission line.

* * * * *